US006563395B2

(12) United States Patent
Ishida et al.

(10) Patent No.: US 6,563,395 B2
(45) Date of Patent: May 13, 2003

(54) POWER SPLITTER/COMBINER CIRCUIT, HIGH POWER AMPLIFIER AND BALUN CIRCUIT

(75) Inventors: Kaoru Ishida, Shijonawate (JP); Masayuki Miyaji, Takarazuka (JP); Hiroaki Kosugi, Hirakata (JP); Shin'ichi Kugou, Yokohama (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/758,427

(22) Filed: Jan. 12, 2001

(65) Prior Publication Data
US 2001/0001548 A1 May 24, 2001

Related U.S. Application Data

(62) Division of application No. 09/150,012, filed on Sep. 9, 1998, now Pat. No. 6,201,439.

(30) Foreign Application Priority Data

Sep. 17, 1997 (JP) .............................. 9-252417
Sep. 17, 1997 (JP) .............................. 9-252419

(51) Int. Cl.[7] .............................................. H01P 5/10
(52) U.S. Cl. ........................................................ 333/26
(58) Field of Search ..................................... 333/26, 33

(56) References Cited

U.S. PATENT DOCUMENTS

| 4,647,868 A | | 3/1987 | Mueller ....................... 330/286 |
| 4,739,289 A | | 4/1988 | Cripps ........................... 333/26 |
| 4,755,775 A | * | 7/1988 | Marczewski et al. ......... 333/26 |
| 5,017,886 A | | 5/1991 | Geller ........................... 330/277 |
| 5,061,910 A | | 10/1991 | Bouny .......................... 333/26 |
| 5,451,914 A | * | 9/1995 | Stengel ..................... 333/26 X |
| 5,497,137 A | | 3/1996 | Fujiki |
| 5,523,728 A | | 6/1996 | McCorkle ................... 333/128 |
| 5,644,272 A | | 7/1997 | Dabrowski |

FOREIGN PATENT DOCUMENTS

| JP | 5-191116 | 7/1993 |
| JP | 8-28607 | 3/1996 |

OTHER PUBLICATIONS

Dye, et al., "Radio Frequency Transistors," Butterworth/Heinemann, 1993, pp 113–116 and pp 179–181.
Bassett, *Microwaves*, 19:7, 47–52, Jul. 1980.
Takao Hasegawa, et al., "Multi–Branch Power Dividers Using Multilayer MMIC Technology," IEICE Transactions on Electronics, vol. E75–C, No. 6, Jun. (1992), pp. 707–712.
Kenjiro Nishikawa, et al., "Miniaturized Wilkinson Power Divider Using Three–Dimensional MMIC Technology," IEEE Microwave and Guided Wave Letters, vol. 6, No. 10, Oct., 1996, pp. 372–374.
T. Gokdemir, et al, "Design and Performance of GaAs MMIC CPW Baluns Using Overlaid and Spiral Couplers," 1997 IEEE MTT–S International Microwave Symposium Digest, published Jun. 8, 1997, pp. 401–404.
Copy of European Communication for counterpart application No. EP 99 11 7393, dated Apr. 19, 2001.

* cited by examiner

Primary Examiner—Benny T. Lee
(74) Attorney, Agent, or Firm—Smith, Gambrell & Russell, LLP

(57) ABSTRACT

A balun design incorporating the functions of a splitter (combiner) which can be employed in a high power amplifier circuit configuration. The balun is formed of a dielectric multilayer board with conductor patterns on each conductor pattern layer. The balun includes the propagation of a half of an input signal to an in-phase output terminal, and also propagating a fourth of the input signal to first and second opposite-phase output terminals, the signal propagated to the first and second opposite-phase output terminals lagging 180 degrees behind the signal propagated to the in-phase output terminal. The balun provides the output signals at the first and second opposite-phase output terminals 180° out of phase employing through holes in the main line and coupling lines for promoting electromagnetic coupling therebetween.

4 Claims, 15 Drawing Sheets

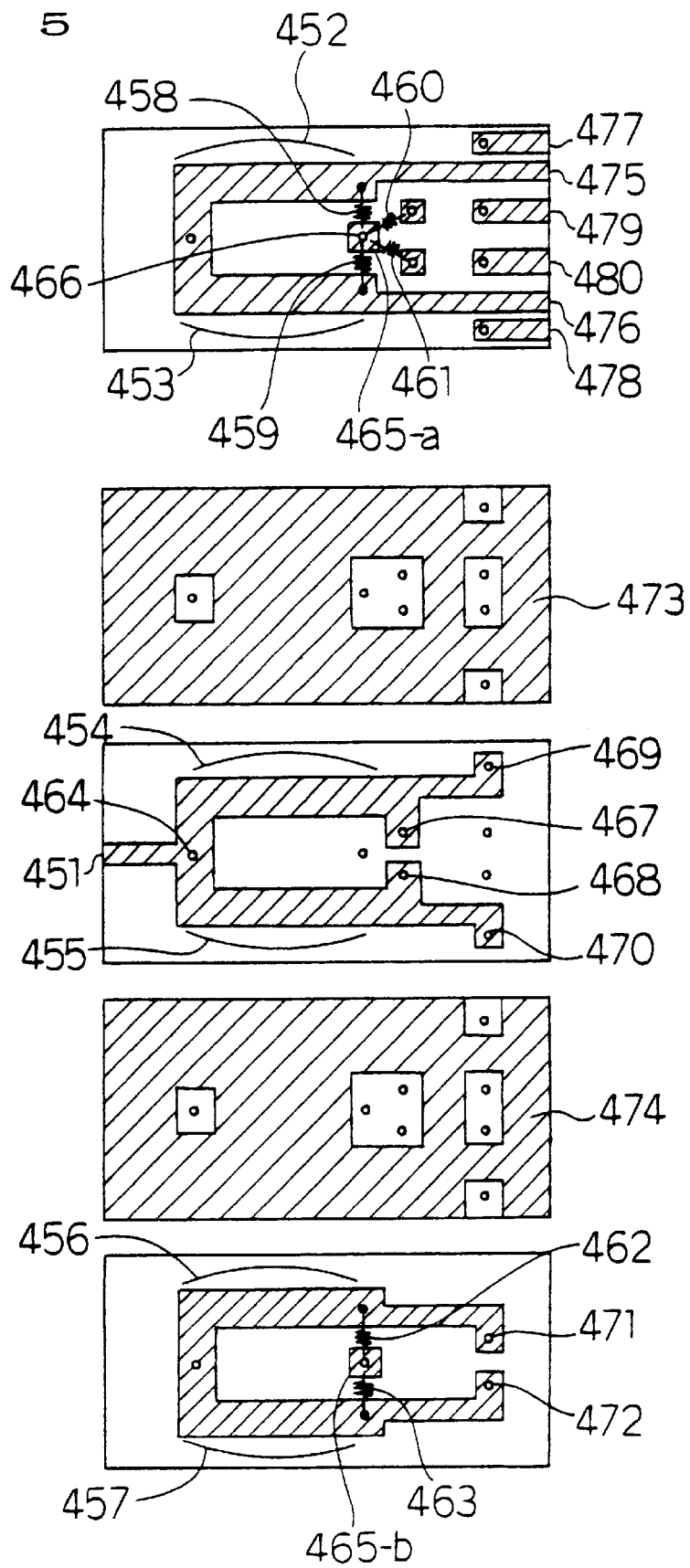

POWER SPLITTER/COMBINER CIRCUIT, HIGH POWER AMPLIFIER AND BALUN CIRCUIT

This is a divisional application of U.S. Ser. No. 09/150, 012 now U.S. Pat. No. 6,201,439 filed Sep. 9, 1998.

BACKGROUND OF THE INVENTION

1. Field of the Invention

The present invention relates to a high power amplifier mainly used at a cellular phone base station, and a balun circuit for the high power amplifier.

2. Related Art of the Invention

A high power amplifier capable of propagating several tens to several hundreds of watts has recently been used at a digital mobile communication base station. This kind of high power amplifier comprises a plurality of push-pull amplifiers combined in parallel to obtain high power, wherein each push-pull amplifier comprises two identical transistors connected in parallel and supplied with signals 180 degrees out of phase with each other. The explanation of the push-pull amplifier has been given on pages 113 to 116 of "Radio Frequency Transistors" written by Norm Dye and Helge Granberg, published by Butterworth/Heinemann. Therefore, no detailed explanation is given here. This power amplifier circuit requires a power splitter/combiner circuit and baluns at both the input and output of the circuit.

A conventional high power amplifier will be described below referring to FIG. 11. In FIG. 11, the numeral 501 designates a n-way power splitter, the numeral 502 designates a n-way power combiner, the numerals 503, 504 designate n baluns, and the numeral 505 designates n pairs of push-pull amplifiers. A power splitter/combiner circuit used in this configuration will be described below while referring to FIGS. 12 and 13. FIGS. 12 and 13 illustrate the configurations of Wilkinson power splitter circuits. FIG. 12A illustrates a general Wilkinson power splitter circuit. The numeral 601 designates an input terminal, the numeral 602 designates n quarter-wavelength lines, the numeral 603 designates n isolation resistors, and the numeral 604 designates n output terminals. FIG. 12B illustrates a tree configuration of 2-splitters capable of being configured as a plane circuit. The numeral 605 designates an input terminal, the numeral 606 designates two quarter-wavelength lines, the numeral 607 designates an isolation resistor, the numeral 608 designates four quarter-wavelength lines, the numeral 609 designates two isolation resistors, and the numeral 610 designates four output terminals. In addition, FIG. 13 illustrates an asymmetric power splitter type. The numeral 611 designates an input terminal, the numerals 612, 613, 616 and 617 designate quarter-wavelength lines having characteristic impedances different from one another, the numerals 614 and 618 designate isolation resistors, and the numerals 615, 619 and 620 designate impedance transformer circuits. The explanation of the Wilkinson power combiner circuit has been given on pages 205 to 210 of "Foundations of Microwave Circuits and Applications thereof" written by Yoshihiro Konishi, published by Sogo Denshi. Therefore, no detailed explanation is given here.

FIG. 14 illustrates the configuration of a conventional balun. The numeral 701 designates an unbalanced terminal, the numeral 702 designates a quarter-wavelength coaxial line having a characteristic impedance of 50Ω, the numeral 703 designates an in-phase output terminal, and the numeral 704 designates an opposite-phase output terminal. The explanation of the balun has been given on pages 179 to 181 of "Radio Frequency Transistors" written by Norm Dye and Helge Granberg, published by Butterworth/Heinemann. Therefore, no detailed explanation is given here.

On the basis of the above-mentioned configurations, the conventional high power amplifier has obtained high power for transmission at a base station by combining a plurality of output powers of push-pull amplifiers.

Although the Wilkinson power splitter circuit shown in FIG. 12A can evenly split power into n-way ports at one time, the circuit cannot be attained as a plane circuit. For this reason, the configurations shown in FIGS. 12B and 13 are used generally. The configuration shown in FIG. 12B, however, lends to a large loss in splitter/combiner configuration due to a long transmission path. In addition, the configuration also has a problem of low versatility, because power can be split and propagated only to $2^n$ paths. Furthermore, the configuration shown in FIG. 13 has a problem of unbalanced power splitting, because transmission paths are different lengths from one output to another. Moreover, the balun shown in FIG. 14 is large in circuit size because of the use of the coaxial line, thereby having a problem of difficulty in miniaturization.

SUMMARY OF THE INVENTION

In order to solve these problems encountered in the conventional high power amplifier circuit, an object of the present invention is to provide a balun with an incorporated high power amplifier circuit having a drastically reduced circuit size due to use of decreased number of components.

The balun in accordance with the present invention, having been configured by using a coaxial line, is configured by using a multilayer board and by providing coupling lines on the layers above and below a strip line, thereby to obtain two opposite-phase outputs. With this configuration, baluns with power splitter/combiner circuits can be formed on a single multilayer board, whereby the high power amplifier circuit can be miniaturized. In addition, since the balun can propagate two opposite-phase outputs, the number of splits can be reduced, whereby the circuit size of the splitter can be made smaller. In addition, since n-splitting/n-combining can be carried out at one time, loss can be reduced, whereby the efficiency of the power amplifier can be improved.

In order to attain the objects, one embodiment of the present invention offers a balun having:

a multilayer comprised of dielectric layers and conductor pattern layers stacked alternately;

a main line disposed on one of said conductor pattern layers;

a plurality of coupling lines each facing a part of said main line, disposed on one or more of said conductor pattern layers different from said conductor pattern layer on which said main line is disposed, so as to be electromagnetically coupled with said facing part of said main line, and grounded electrically respectively;

an input line disposed on one of said conductor pattern layers; and output line pairs with respective pairs being connected across corresponding coupling line ends, wherein one end of said main line is connected to said input line, the other end thereof is electrically grounded, the power of a signal input to said input line is split and propagated to each of said output terminal pairs via each of said coupling lines, and a signal propagated from one output line of each said output line pair is 180 degrees out of phase with the other signal propagated from the other output line.

BRIEF DESCRIPTION OF THE DRAWINGS

FIG. 5 is a view showing the conductor patterns of a six-way power splitter in accordance with another example of the second embodiment;

(DESCRIPTION OF REFERENCE NUMERALS)

Figure 1:
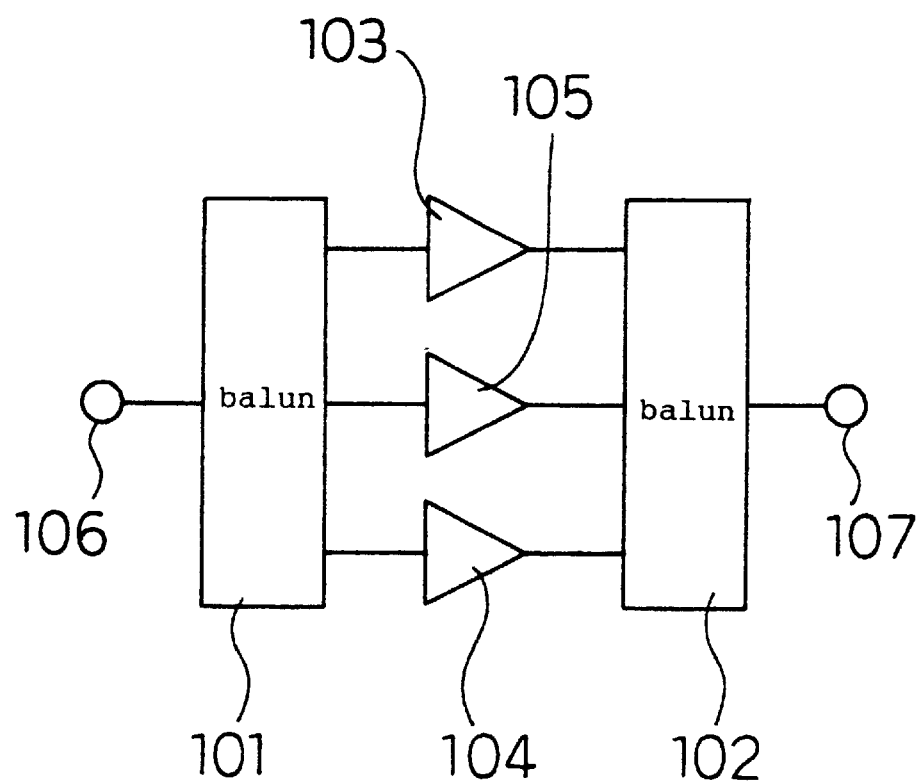
FIG. 1 is a view showing the configuration of a high power amplifier in accordance with a first embodiment of the present invention.

101, 102 baluns
207 main line
208 first coupling line
209 second coupling line
214 in-phase output terminal
215 first opposite-phase output terminal
216 second opposite-phase output terminal
301, 302 power 4-splitters
303 high power amplifier
407–410 first to fourth quarter-wavelength lines
411–414 first to fourth isolation resistors
421–424 first to fourth 4-split output terminals
501 n-way power splitter
502 n-way power combiner
503, 504 baluns
505 push-pull amplifier
1010, 1020, 2010–2040, 3010–3050 dielectric layers
1030, 2050, 3060 input lines
1040 main line
1050, 1060, 2080, 2090, 3090, 3100 coupling lines
1070, 1080, 2100, 2110, 3110, 3120 output line pairs
1090, 1100, 2120–2160, 3130–3170 through holes
1110–1130, 2170–2210, 3180–3220 grounding conductors
2060, 2070, 3070, 3080 main line portions
3230 shield conductor layer
7040, 8040 part of main line
7050, 8050 coupling line

PREFERRED EMBODIMENTS OF THE INVENTION

The present invention will be described below referring to the accompanying drawings showing embodiments thereof.

First Embodiment

FIG. 1 is a view showing the configuration of a high power amplifier in accordance with a first embodiment of the present invention. Referring to FIG. 1, the numerals 101, 102 designate baluns, the numerals 103, 104 designate power amplifiers having identical characteristics, the numeral 105 designates a power amplifier generating output power twice as high as that of the power amplifier 103 or 104, the numeral 106 designates an input terminal, and the numeral 107 designates an output terminal.

Figure 2A:
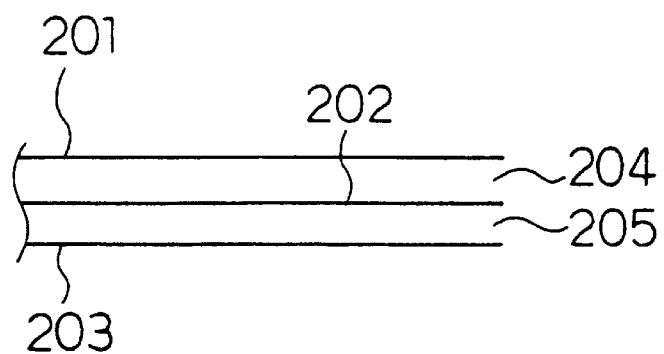
FIG. 2A is a sectional view showing a balun for the high power amplifier in accordance with the first embodiment.
Figure 2B:
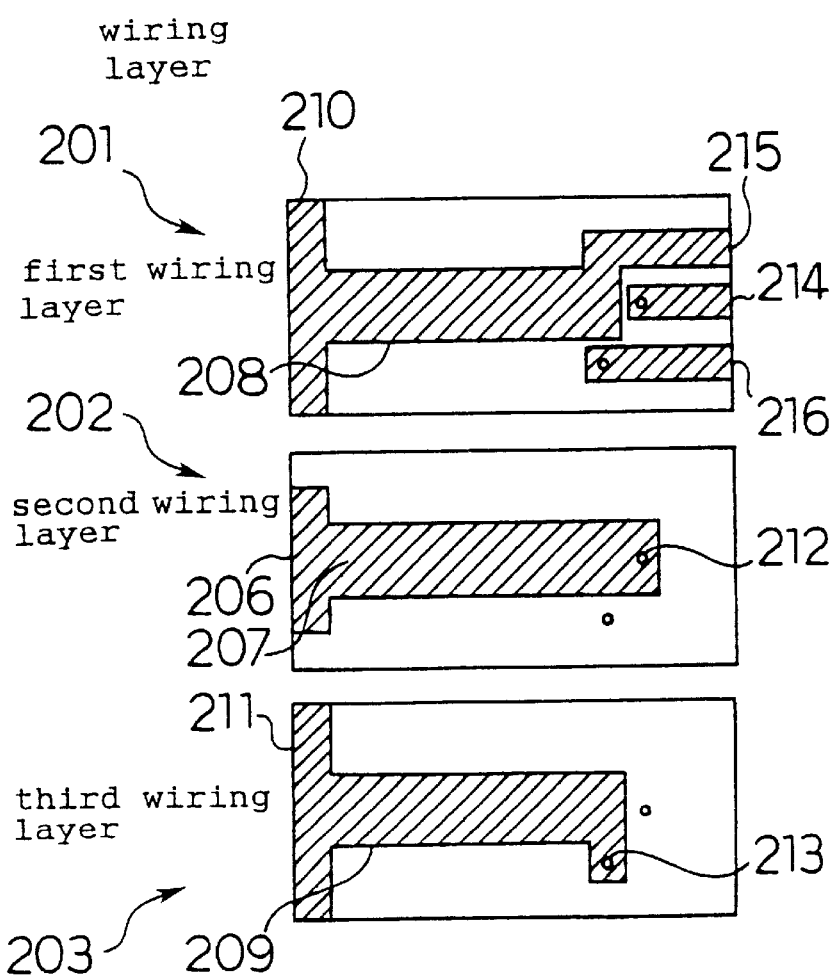
FIG. 2B is a view showing the conductor patterns of the balun.

In this configuration, a balun used for the present invention will be detailed below referring to FIGS. 2A to 2C. FIG. 2A is a sectional view showing a balun formed of a dielectric multilayer board, FIG. 2B is a view showing conductor patterns on each conductor pattern layer, and FIG. 2C is a view illustrating the operation of the balun.

Referring to FIG. 2A, the numerals 201 to 203 designate first to third conductor pattern layers, and the numerals 204, 205 designate first and second dielectric layers. Referring to FIG. 2B, the top drawing shows the first conductor pattern layer 201, the middle drawing shows the second conductor pattern layer 202, and the bottom drawing shows the third conductor pattern layer 203. The numeral 206 designates an input terminal provided on the second conductor pattern layer 202, to which signals are input. The numeral 207 designates a main line connected to the input terminal. At the other end of the main line, a first through hole 212 is formed. The numeral 208 designates a first coupling line provided on the first conductor pattern layer 201. The numeral 209 designates a second coupling line provided on the third conductor pattern layer 203. The main line and the coupling lines are oriented at positions to face one another, and are coupled electromagnetically. The numeral 210 designates a first grounding conductor provided on the first conductor pattern layer 201, and the numeral 211 designates a second grounding conductor provided on the third conductor pattern layer 203. The grounding conductors 210, 211 are connected to the coupling lines 208, 209, respectively. The numeral 212 designates the first through hole formed at the other end of the main line 207, and the numeral 213 designates a second through hole formed at the other end of the second coupling line 209. The numeral 214 designates an in-phase output terminal formed on the first conductor pattern layer 201 and connected to the first through hole. The numeral 215 designates a first opposite-phase output terminal formed at the other end of the first coupling line 208 on the first conductor pattern layer 201. The numeral 216 designates a second opposite-phase output terminal formed on the first conductor pattern layer 201 and connected to the second through hole 213. Referring to FIG. 2C, the numeral 217 designates an input terminal, the numeral 218 designates a main line, the numerals 219, 220 designate first and second coupling lines, respectively. The numeral 221 designates an in-phase output terminal. The numerals 222, 223 designate first and second opposite-phase output terminals, respectively.

Figure 2C:
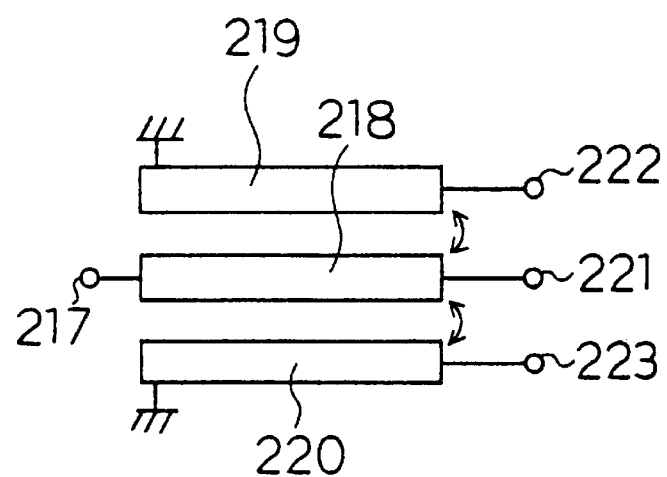
FIG. 2C is a view illustrating the operation of the balun.
Figure 2D:
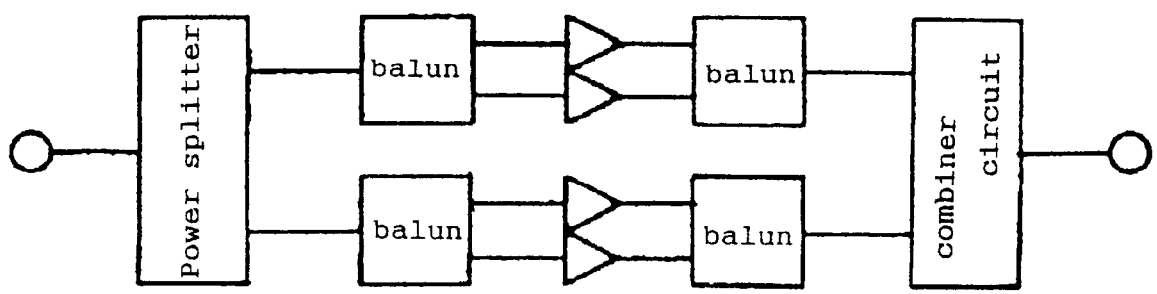
FIG. 2D is a schematic view showing a conventional high power amplifier comprising two power splitter/combiner circuits and four baluns.

Referring to FIG. 2C, a radio-frequency signal input from the input terminal 217 is split in terms of power and propagated to the first coupling line 219 and the second coupling line 220, which are coupled at an appropriate coupling degree. By grounding the input terminal sides of the first and second coupling lines, the output signals at the first and second opposite-phase output terminals are 180 degrees out of phase with the input signal. The coupling degree is determined depending on the dielectric constant and thickness of the dielectric and the widths of the main line and the coupling lines. In the present embodiment, a balun having the above-mentioned configuration and capable of obtaining one in-phase output and two opposite-phase outputs from one input is used at the input and output of the embodiment. Consequently, the number of components in the high power amplifier of the present embodiment can be made less than the number of components in a conventional high power amplifier shown in FIG. 2D, comprising two power splitter circuits and four baluns, whereby the circuit of the power amplifier can be made smaller.

Second Embodiment

Figure 3:
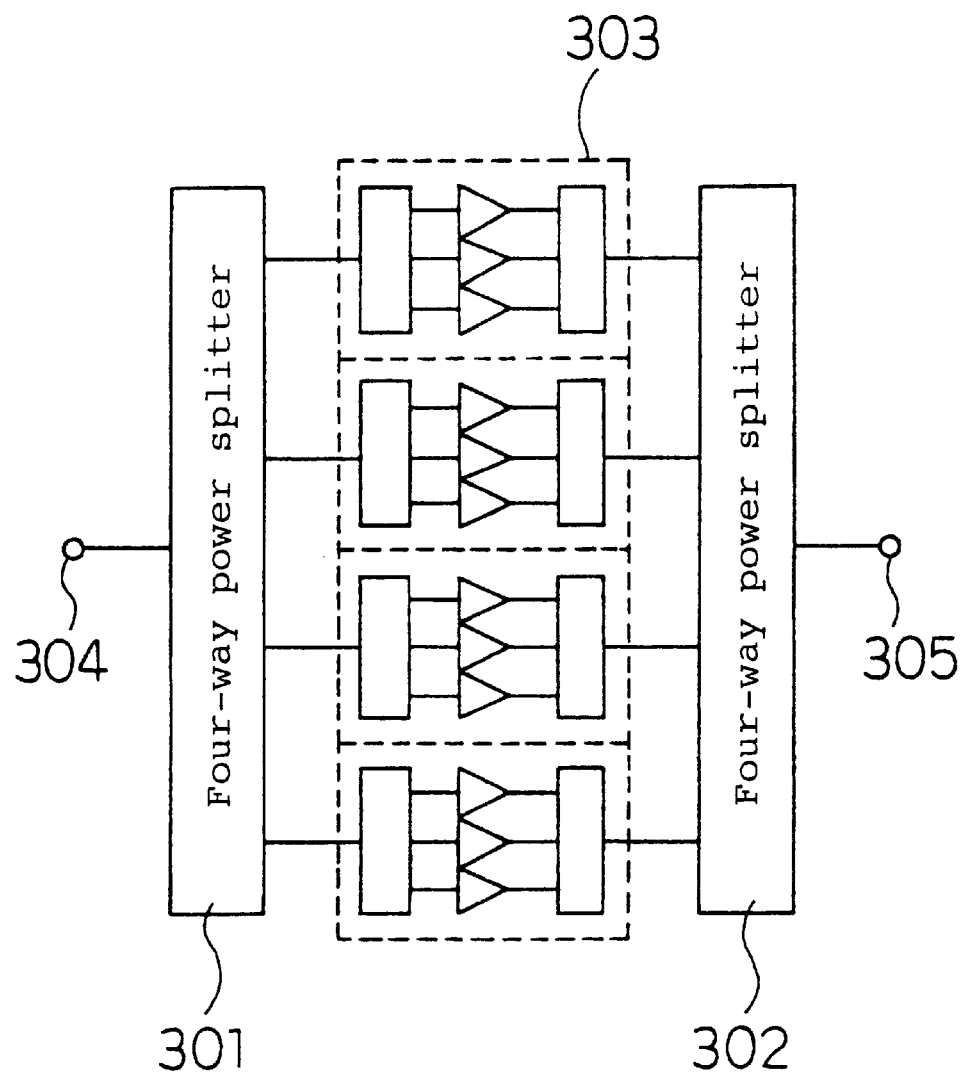
FIG. 3 is a view showing the configuration of a high power amplifier in accordance with a second embodiment of the present invention.

FIG. 3 is a view showing the configuration of a high power amplifier in accordance with a second embodiment of the present invention. Referring to FIG. 3, the numerals 301, 302 designate four-way power splitter, the numeral 303 designates the high power amplifier described in the explanation of the first embodiment, the numeral 304 designates an input terminal, and the numeral 305 designates an output terminal.

Figure 4A:
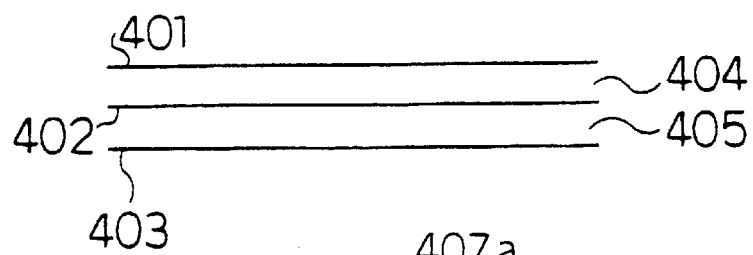
FIG. 4A is a sectional view showing a four-way power splitter for the high power amplifier in accordance with the second embodiment.
Figure 4B:
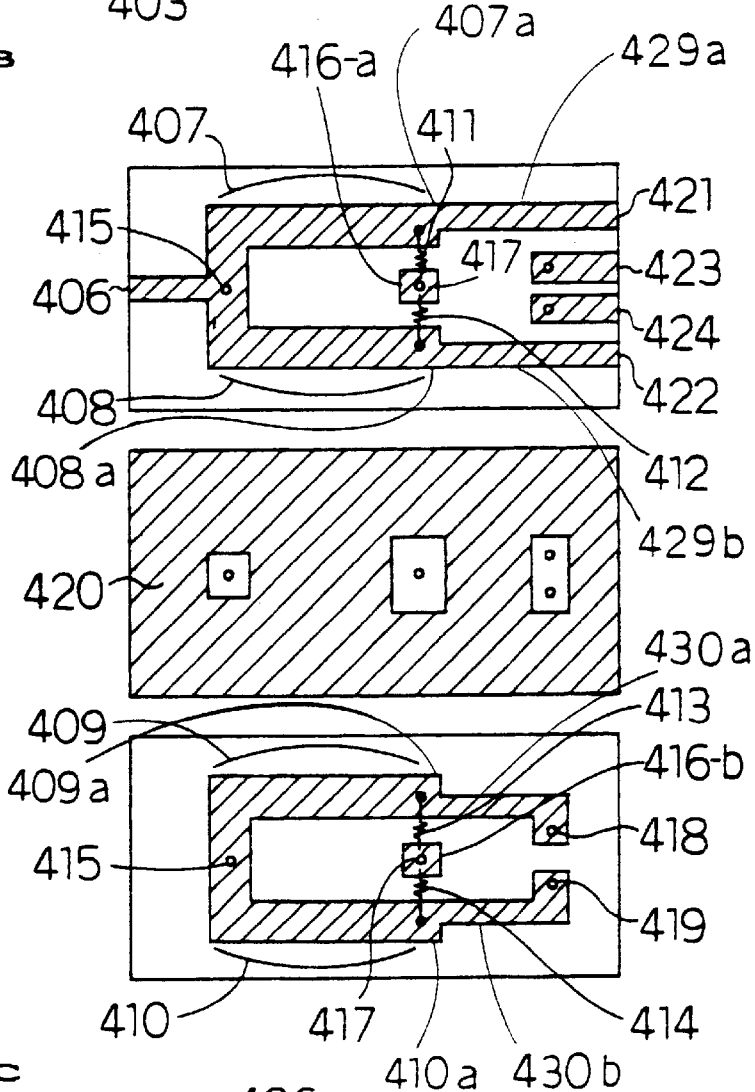
FIG. 4B is a view showing the conductor patterns of the four-way power splitter.
Figure 4C:
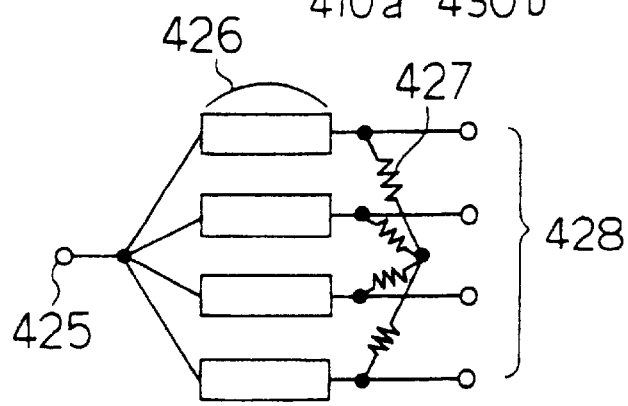
FIG. 4C is a circuit diagram of the four-way power 4-splitter.

In this configuration, the power 4-splitter used for the present invention will be detailed below referring to FIGS. 4A to 4C. FIG. 4A is a sectional view showing the power 4-splitter formed of a dielectric multilayer board. FIG. 4B is a view showing the conductor patterns on the conductor pattern layers of the board. FIG. 4C is a circuit diagram of the power 4-splitter. Referring to FIG. 4A, the numerals 401 to 403 designate first to third conductor pattern layers, and the numerals 404, 405 designate the first and second dielectric layers. Referring to FIG. 4B, the numeral 406 designates an input terminal, the numerals 407 to 410 designate first to fourth quarter-wavelength lines, the numerals 411 to 414 designate first to fourth isolation resistors, the numeral 415 designates a first through hole, the numerals 416-a, 416-b designate a common terminal on conductive pattern layers 401, 402 respectively, the numerals 417, 418, 419 designate second to fourth through holes, the numeral 420 designates a shield conductor, and the numerals 421, 422, 423, 424 designate first to fourth split output terminals. Referring to FIG. 4C, the numeral 425 designates an input terminal, the numeral 426 designates quarter-wavelength lines, the numeral 427 designates isolation resistors, and the numeral 428 designates split output terminals.

Returning to FIG. 4B, the numeral 407a designates an end of the first quarter-wavelength line 407, away from the input terminal 406. The numeral 408a designates an end of the second quarter-wavelength line 408, away from the input terminal 406. The numeral 429a designates a first output line, and the numeral 429b designates a second output line.

Moreover, the numeral 409a designates an end of the third quarter-wavelength line 409, disposed on the opposite side of the first through hole 415. The numeral 410a designates an end of the fourth quarter-wavelength line 410, disposed on the opposite side of the first through hole 415. The numeral 430a designates a third output line, and the numeral 430b designates a fourth output line.

A method of embodying a non-planer Wilkinson four-way power splitter shown in FIG. 4C by using the dielectric three-layer board shown in FIG. 4A will be described below.

Examples of the first to third conductor pattern layers shown in FIG. 4A will be described below referring to FIG. 4B. A signal input from the input terminal 406 is split and propagated to the first quarter-wavelength line 407 and the second quarter-wavelength line 408, the two lines having the same characteristic impedance, and is also split and propagated to the third quarter-wavelength line 409 and the fourth quarter-wavelength line 410 via the first through hole 415. Furthermore, the other ends of the quarter-wavelength lines 407 to 410 are connected to the common terminal 416-a and the common terminal 416-b connected to the common terminal 416-a via the second through hole 417, by means of the first to fourth isolation resistors 411 to 414, respectively. These split outputs are propagated from the first to fourth split output terminals 421 to 424.

Furthermore, the shield conductor 420 surrounding the through holes are provided on the second conductor pattern layer 402 between the first conductor pattern layer 401 and the third conductor pattern layer 403 to prevent signal interference between the first conductor pattern layer 401 and the third conductor pattern layer 403. The four way power splitter having the above-mentioned structure and the balun disclosed in the first embodiment are used to form a high power amplifier on the same dielectric multilayer board. Consequently, the number of components in the high power amplifier of the present embodiment can be made less than the number of components in a conventional high power amplifier comprising two eight-way power circuits (14 two-way power splitters) and 16 baluns, whereby the circuit can be made smaller. Moreover, since four-way splitting and four-way combining are carried out at one time, loss can be reduced, and the efficiency of the power amplifier can be improved.

The power splitter used in the above-mentioned second embodiment is a four-way power splitter type. However, four or more splits can be attained as desired by increasing the number of layers of the dielectric board. A six-way power splitter circuit formed of a dielectric five-layer board is shown in FIG. 5 as an example.

Referring to FIG. 5, the numeral 451 designates an input terminal, the numerals 452 to 457 designate first to sixth quarter-wavelength lines, the numerals 458 to 463 designate first to sixth isolation resistors, the numeral 464 designates a first through hole, the numerals 465-a, 465-b designate common terminals, the numerals 466 to 472 designate second to eighth through holes, the numeral 473, 474 designate first and second shield conductors, and the numerals 475 to 480 designate first to sixth split output terminals.

With this configuration, just as in the case of the power 4-split circuit of the second embodiment, a signal input from the input terminal 451 is split and propagated to six quarter-wavelength lines 452 to 457 via the first through hole 464. Furthermore, the other ends of the quarter-wavelength lines 452 to 457 are connected to the common terminal 465-*a* and the common terminal 465-*b* connected to the common terminal 465-*a* via the second through hole 466, by means of the first to sixth isolation resistors 458 to 463, respectively. The isolation resistors 460, 461 for the third conductor pattern layer are taken out to the first conductor pattern layer via the third and fourth through holes 467, 468 respectively and connected to the common terminal 465-*a*. Although the third and fourth isolation resistors 460, 461 are taken out to the first conductor pattern layer in the above description, the same circuit can be obtained when the resistors are taken out to the fifth conductor pattern layer and connected to the common terminal 465-*b*.

Furthermore, by expanding this structure, a power splitter having a given number of splits can be formed. With this structure, just as in the case that the four-way power splitter circuit in accordance with the second embodiment is used, a high power amplifier having a large split number can be made smaller, and the number of components thereof can be reduced, whereby the efficiency of the power amplifier can be further improved.

As described above, in the high power amplifier in accordance with the present invention, the power splitter circuits and the baluns thereof are formed on a dielectric multilayer board, thereby offering advantages in that the number of components can be reduced and the circuits can be made smaller drastically, unlike conventional power splitter circuits and baluns which were large in size, The splitter (combiner) and the balun of the high-output amplifier circuit in accordance with the above-mentioned present invention as well as those of the conventional high-output amplifier circuit are formed independently of each other.

However, instead of the independent formation, a balun circuit having the functions of a splitter (combiner) is desired to be embodied.

Third Embodiment

Figure 6:
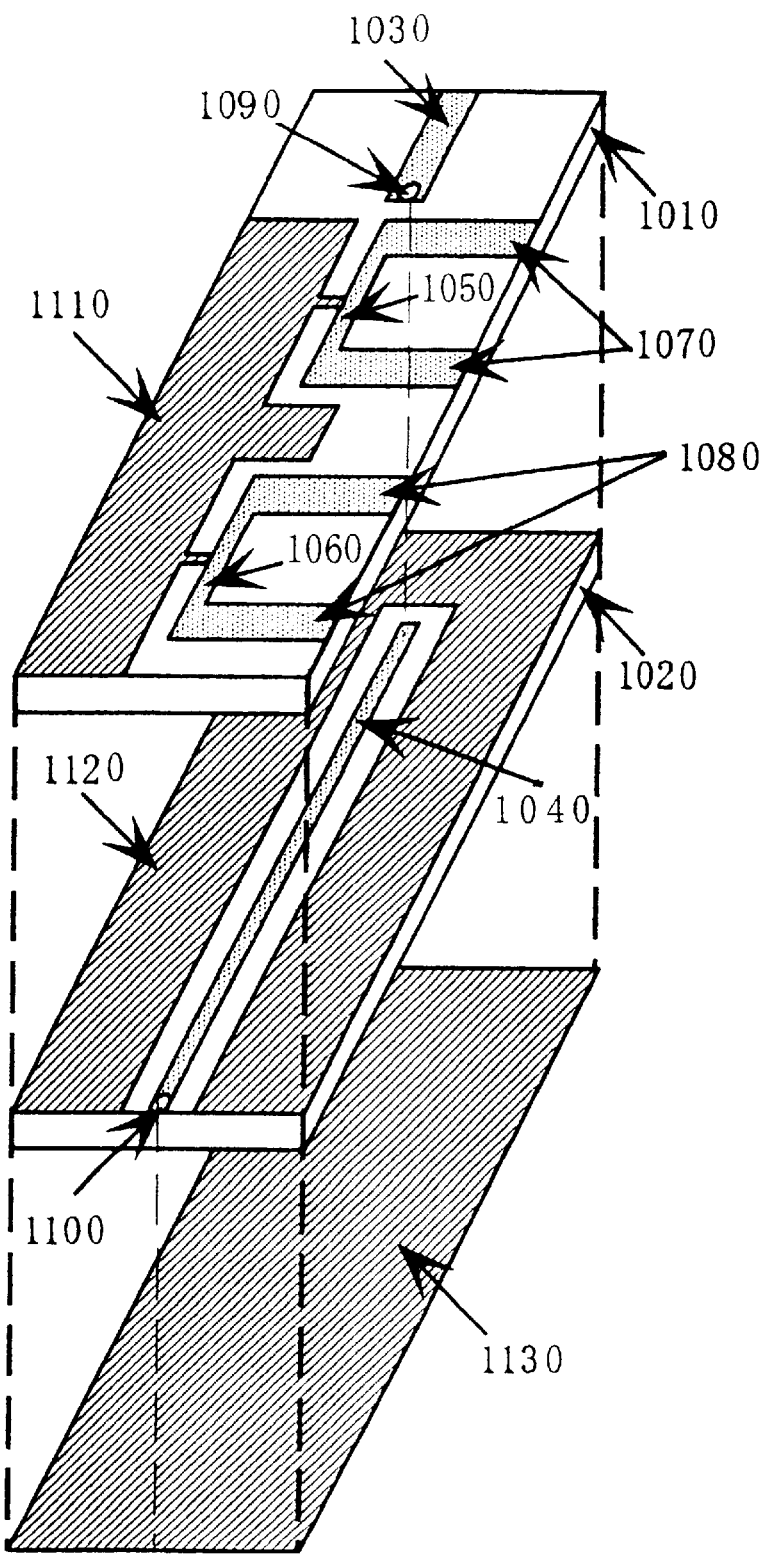
FIG. 6 is a view showing the configuration of a balun in accordance with a third embodiment of the invention.

FIG. 6 is a view showing the configuration of a balun in accordance with a third embodiment of the present invention. Referring to FIG. 6, the numerals 1010, 1020 designate first and second dielectric layers, the numeral 1030 designates an input line, the numeral 1040 designates a main line, the numerals 1050, 1060 designate first and second coupling lines, the numerals 1070, 1080 designate first and second output line pairs, the numerals 1090, 1100 designate first and second through holes, and the numerals 1110 to 1130 designate first to third grounding conductors. The first to third grounding conductors 1110 to 1130 have been electrically connected to one another via through holes or the like (not shown). Among the above-mentioned electrodes and lines, the electrodes and lines disposed on the same plane each form layers, and these layers correspond to the conductor pattern layers in accordance with the present invention. These conductor pattern layers are alternately stacked with the first and second dielectric layers to form the multilayer in accordance with the present invention.

The operation of the balun having the above-mentioned configuration will be described below.

When a radio-frequency signal is input to the input line 1030, electromagnetic couplings occur between the main line 1040 and the first coupling line 1050 and between the main line 1040 and the second coupling line 1060, the first and second coupling lines 1050, 1060 being disposed adjacent to the main line 1040. When the two couplings have the same coupling degree, the radio-frequency signal is equally split and sent to the first and second coupling lines 1050, 1060. The split signal is further split into two equal signals, and the two signals are propagated to the two lines of the first output line pair 1070 connected to both ends of the first coupling line 1050, respectively. The two signals are 180 degrees out of phase with each other. In the same manner, two equally split radio signals 180 degrees out of phase with each other are also propagated to the two lines of the second output line pair 1080 connected to both ends of the second coupling line 1060, respectively. In other words, the balun circuit shown in FIG. 6 has the functions of a power 2-splitter as well as the functions of a balun. In addition, the coupling degree between the main line 1040 and the first and second coupling lines 1050, 1060 is determined depending on the dielectric constant and thickness of the first dielectric layer between the main line 1040 and the first and second coupling lines 1050, 1060, and the widths of the main line 1040 and the first and second coupling lines 1050, 1060.

With the configuration shown in FIG. 6, the circuit can be made smaller in comparison with the configuration wherein the splitter (combiner) and the balun are formed independently of each other.

It has been described that two coupling lines are used in the above-mentioned embodiment of the present invention, and that the balun in accordance with the present embodiment has a two-way splitting function. However, in addition to these configurations, a balun circuit having three or more coupling lines and an N-splitting function may also be used.

Furthermore, it has been described that the two coupling lines in accordance with the present embodiment of the present invention are formed on the same conductor pattern layer. However, in addition to this configuration, the two coupling lines may be formed separately on different conductor pattern layers other than the conductor pattern layer on which the main line is formed.

Furthermore, it has been described that the main line in accordance with the present embodiment of the present invention is formed only on a conductor pattern layer. However, the main line may be formed across a plurality of conductor pattern layers.

Moreover, it has been described that the coupling degree between the main line and one of the two coupling lines is the same as that between the main line and the other coupling line. However, different coupling degrees may be used to form a balun having an asymmetrical splitting function.

Fourth Embodiment

Figure 7:
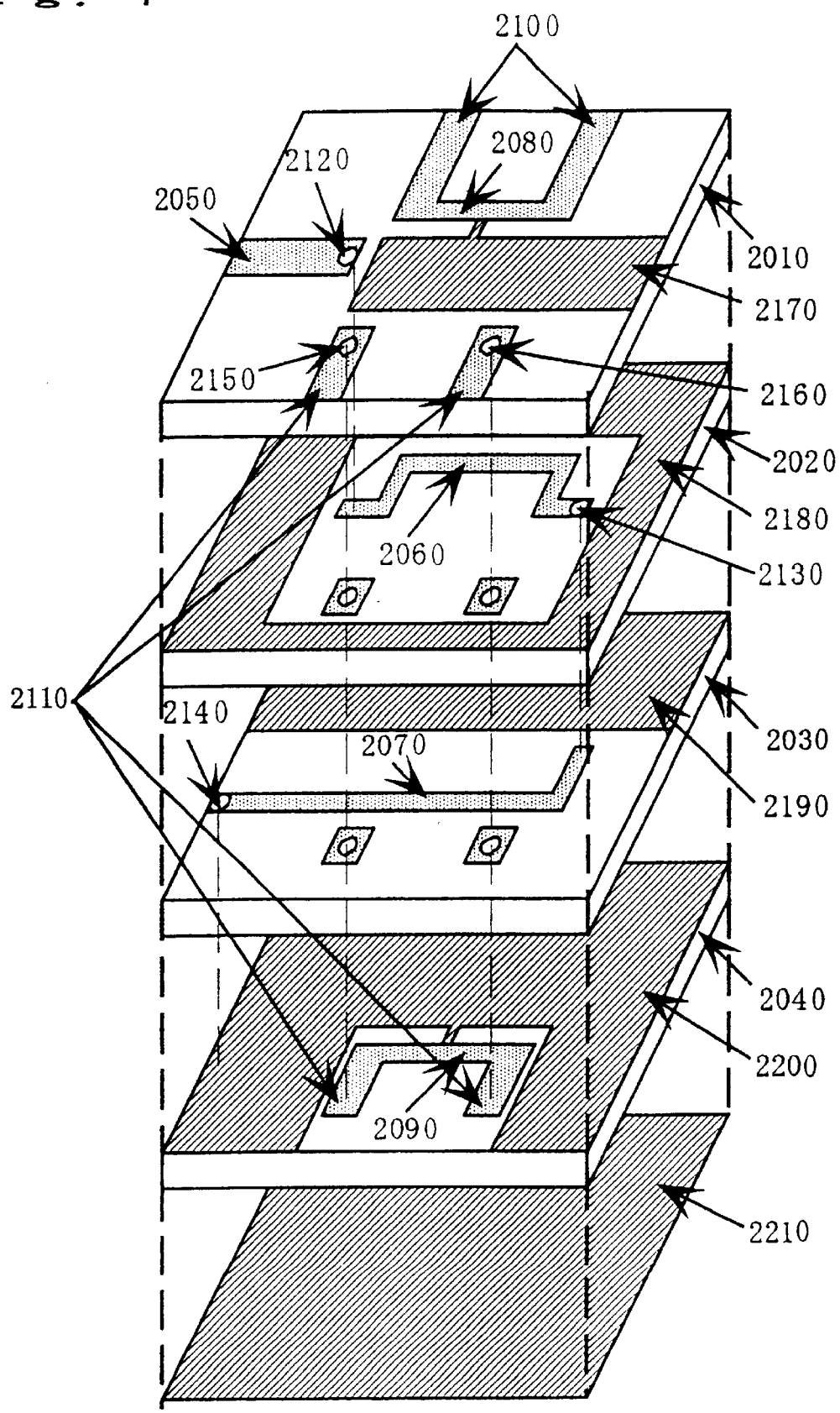
FIG. 7 is a view showing the configuration of a balun in accordance with a fourth embodiment of the invention.

A fourth embodiment of the present invention will be described below referring to the accompanying drawing. FIG. 7 is a view showing a balun in accordance with the fourth embodiment of the present invention. Referring to FIG. 7, the numerals 2010 to 2040 designate first to fourth dielectric layers, the numeral 2050 designates an input line, the numerals 2060, 2070 designate first and second main line portions, the numerals 2080, 2090 designate first and second coupling lines, the numerals 2100, 2110 designate first and second output line pairs, the numerals 2120 to 2160 designate first to fifth through holes, and the numerals 2170 to 2210 designate first to fifth grounding conductors. The first to fifth grounding conductors 2170 to 2210 are connected electrically to one another via through holes or the like (not shown). Among the above-mentioned electrodes and lines, the electrodes and lines disposed on the same plane form each of layers, and these layers correspond to the conductor pattern layers in accordance with the present invention.

These conductor pattern layers are alternately stacked with the first to fourth dielectric layers 2010 to 2040 to form the multilayer in accordance with the present invention. In addition, the first and second main line portions 2060, 2070 and the second through hole 2130 used to connect the first and second main line portions form the main line in accordance with the present invention. The coupling degree between the first main line portion 2060 and the first coupling line 2080 is the same as that between the second main line portion 2070 and the second coupling line 2090.

The operation of the balun having the above-mentioned configuration is the same as that in accordance with the third embodiment.

With the configuration shown in FIG. 7, the mount area of the balun circuit can be made smaller than that of the balun circuit in accordance with the third embodiment wherein the first and second coupling lines are formed on the same plane.

It has been described that two coupling lines are used in the above-mentioned embodiment of the present invention, and that the balun in accordance with the present embodiment has a two-way splitting function. However, in addition to these configurations, a balun circuit having three or more coupling lines and an N-splitting function may also be used. In this case, a plurality of main line portions may be disposed on the same conductor pattern layer wherein the plural main line portions may not be connected directly to one another on the conductor pattern layer.

Furthermore, in the above-mentioned embodiment of the present invention, it has been described that only one coupling line is formed on a conductor pattern layer. However, in addition to this configuration, two or more coupling lines may be formed on a conductor pattern layer.

Furthermore, in the above-mentioned embodiment, it has been described that the main line portions and the coupling lines are all formed on different conductor pattern layers. However, a main line portion and a coupling line not coupled to each other may be formed on the same conductor pattern layer. With this configuration, the number of the dielectric layers and the number of the conductor pattern layers to be stacked with one another can be reduced.

Moreover, it has been described that the coupling degree between one of the two main line portions and one of the two coupling lines is the same as that between the other main line portion and the other coupling line. However, different coupling degrees may be used to form a balun having an asymmetrical splitting function.

Fifth Embodiment

Figure 8:
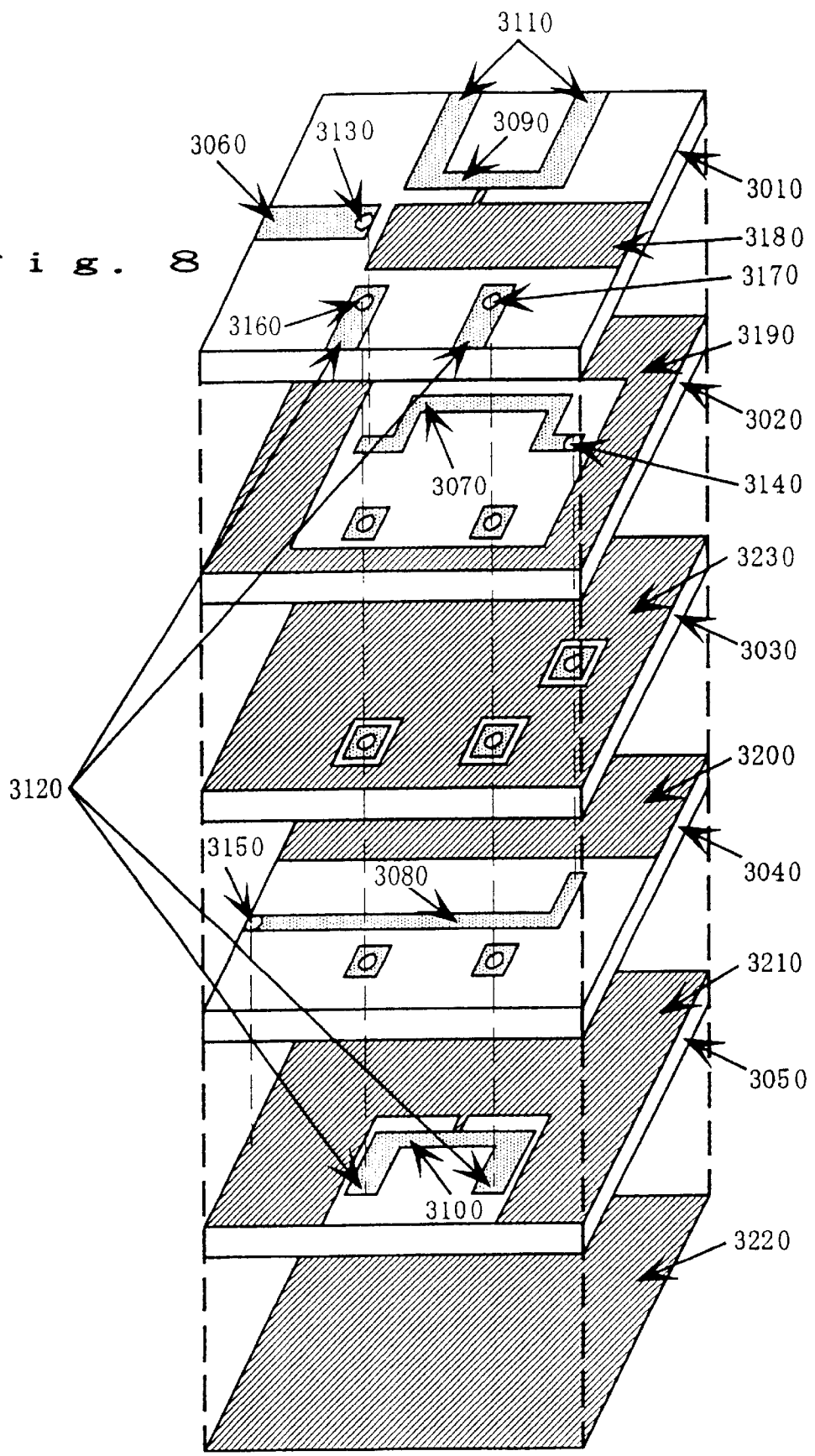
FIG. 8 is a view showing the configuration of a balun in accordance with a fifth embodiment of the invention.

A fifth embodiment of the present invention will be described below referring to the accompanying drawing. FIG. 8 is a view showing the configuration of a balun in accordance with the fifth embodiment of the present invention. Referring to FIG. 8, the numerals 3010 to 3050 designate first to fifth dielectric layers, the numeral 3060 designates an input line, the numerals 3070, 3080 designate first and second main line portions, the numerals 3090, 3100 designate first and second coupling lines, the numerals 3110, 3120 designate first and second output line pairs, the numerals 3130 to 3170 designate first to fifth through holes, the numerals 3180 to 3220 designate first to fifth grounding conductors, and the numeral 3230 designates a shield conductor layer. The first to fifth grounding conductors are connected electrically to the shield conductor layer 3230 via through holes or the like (not shown). Among the above-mentioned electrodes and lines, the electrodes and lines disposed on the same plane each form layers, and these layers correspond to the conductor pattern layers in accordance with the present invention. These conductor pattern layers and the shield conductor layer 3230 are alternately stacked with the first to fifth dielectric layers 3010 to 3050 to form the multilayer in accordance with the present invention. In addition, the first and second main line portions 3070, 3080 and the second through hole 3140 used to connect the first and second main line portions to each other form the main line in accordance with the present invention. The coupling degree between the first main line portion 3070 and the first coupling line 3090 is the same as that between the second main line portion 3080 and the second coupling line 3100.

The operation of the balun having the above-mentioned configuration is the same as that in accordance with the third embodiment, with the exception of the operation regarding the shield conductor layer 3230.

The present embodiment is provided with the shield conductor layer 3230 to prevent unnecessary coupling between the first main line portion 3070 and the second main line portion 3080, unnecessary coupling between the first main line portion 3070 and the second coupling line 3100, and unnecessary coupling between the second main line portion 3080 and the first coupling line 3090.

It has been described that two coupling lines are used in the above-mentioned embodiment of the present invention, and that the balun in accordance with the present embodiment has a two-way splitting function. However, in addition to these configurations, a balun circuit having three or more coupling lines and an N-splitting function may also be used. In this case, a plurality of main line portions may be disposed on the same conductor pattern layer wherein the plural main line portions may not be connected directly to one another on the conductor pattern layer.

Furthermore, in the above-mentioned embodiment, it has been described that the only one coupling line is formed on a conductor pattern layer. However, in addition to this configuration, two or more coupling lines may be formed on a conductor pattern layer.

Furthermore, in the above-mentioned embodiment, it has been described that the main line portions and the coupling lines are all formed on different conductor pattern layers. However, a main line portion and a coupling line not coupled to each other may be formed on the same conductor pattern layer. With this configuration, the number of the dielectric layers and the number of the conductor pattern layers to be stacked can be reduced.

Moreover, it has been described that the coupling degree between one of the two main line portions and one of the two coupling lines is the same as that between the other main line portion and the other coupling line. However, different coupling degrees may be used to form a balun having an asymmetrical splitting function.

Furthermore, it has been described that the shield conductor in accordance with the above-mentioned embodiment of the present invention is formed on the entire surface of a conductor pattern layer. However, in addition to this configuration, the shield conductor may be formed on a plurality of conductor pattern layers, or formed on a part of a conductor pattern layer on which other electrodes and lines are formed, provided that the shield conductor is disposed on a conductor pattern layer sandwiched between at least two of the plural conductor pattern layers across which the main line is disposed.

Figure 9:
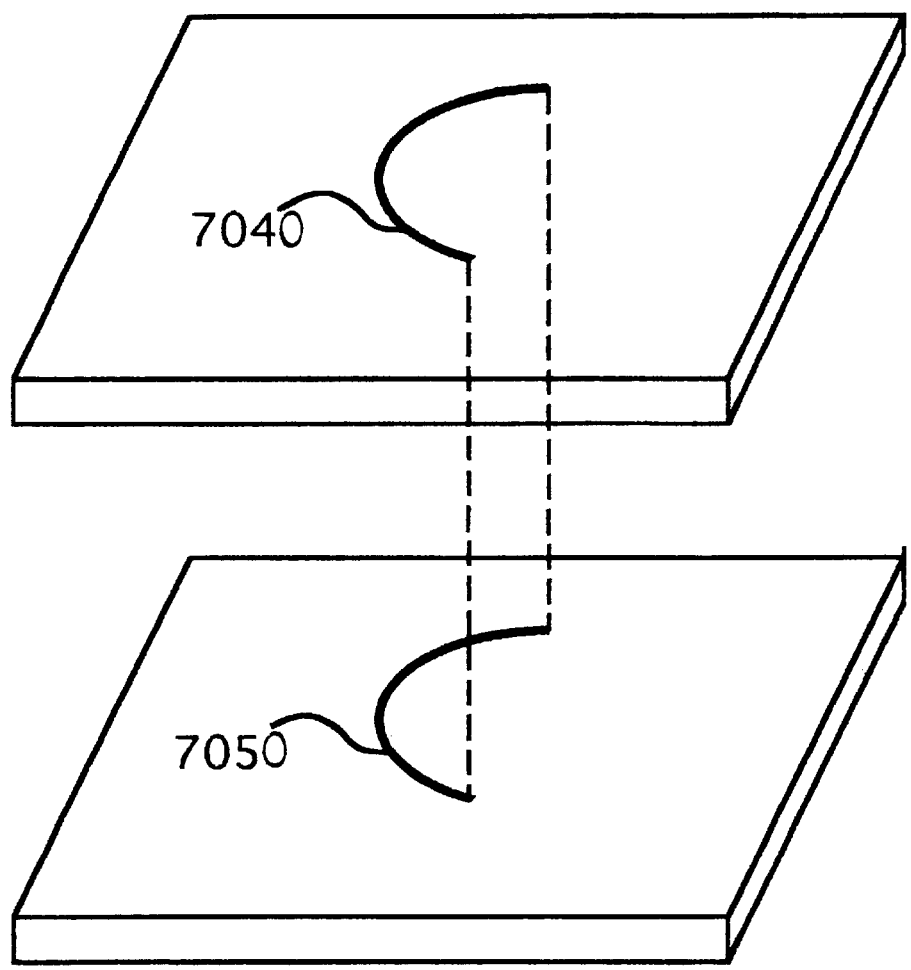
FIG. 9 is a view showing an example of the arrangement relationship between a part of the main line and a coupling line in the balun of the present invention.
Figure 10:
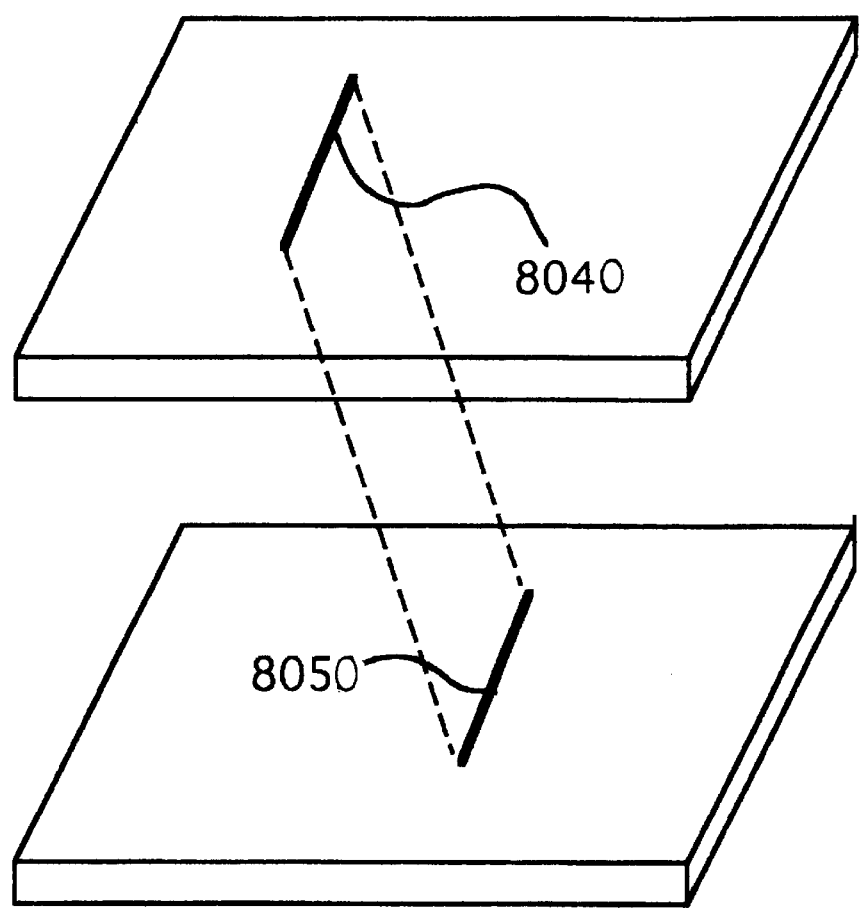
FIG. 10 is a view showing another example of the arrangement relationship between a part of the main line and a coupling line in the balun of the present invention.
Figure 11:
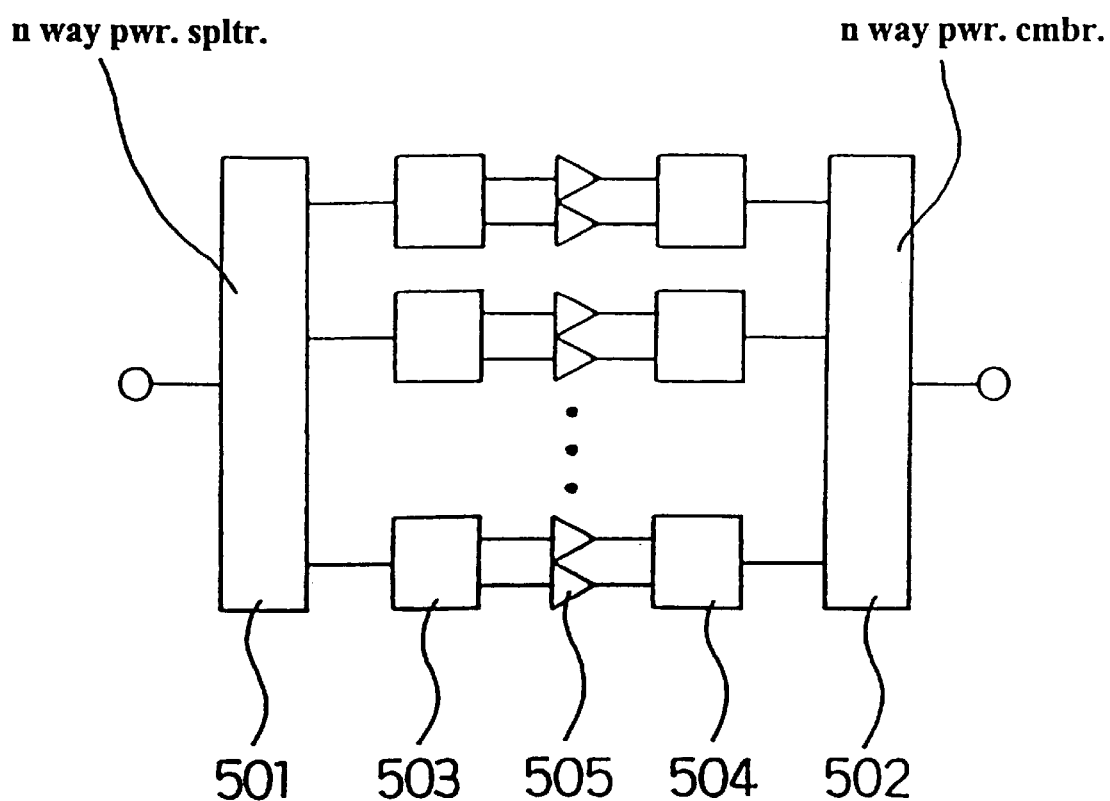
FIG. 11 is a view showing the configuration of a conventional high power amplifier.
Figure 12A:
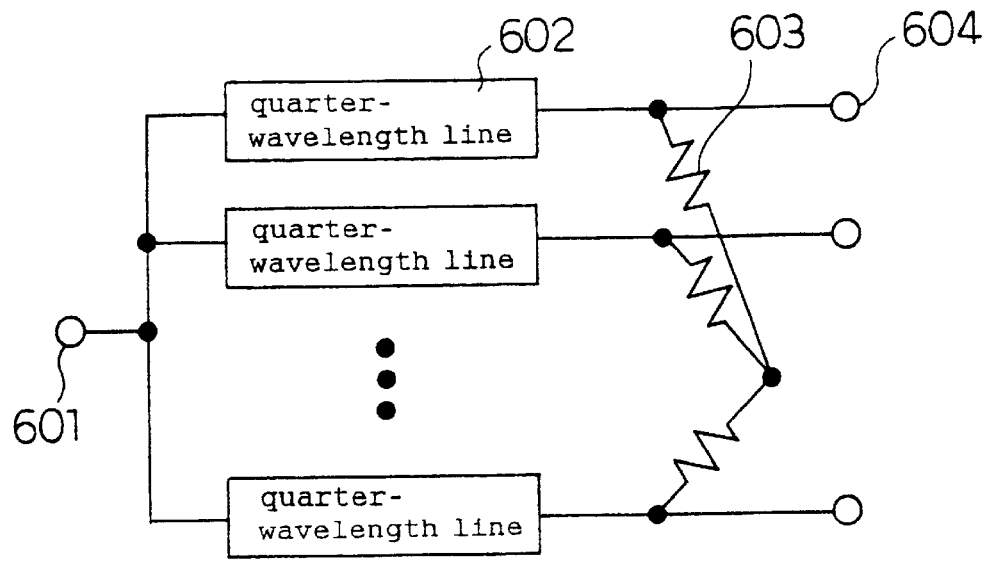
FIG. 12A is a circuit diagram of a general Wilkinson power splitter.
Figure 12B:
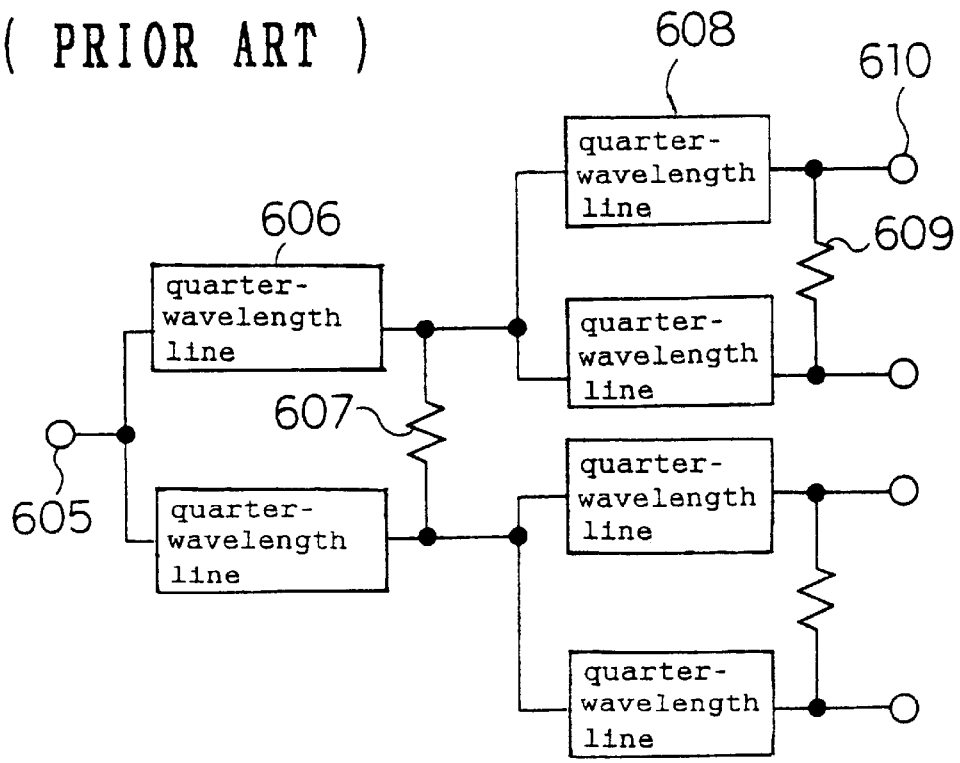
FIG. 12B is a circuit diagram of a one-input, multi-splitter comprising a Wilkinson two-way power splitter.
Figure 13:
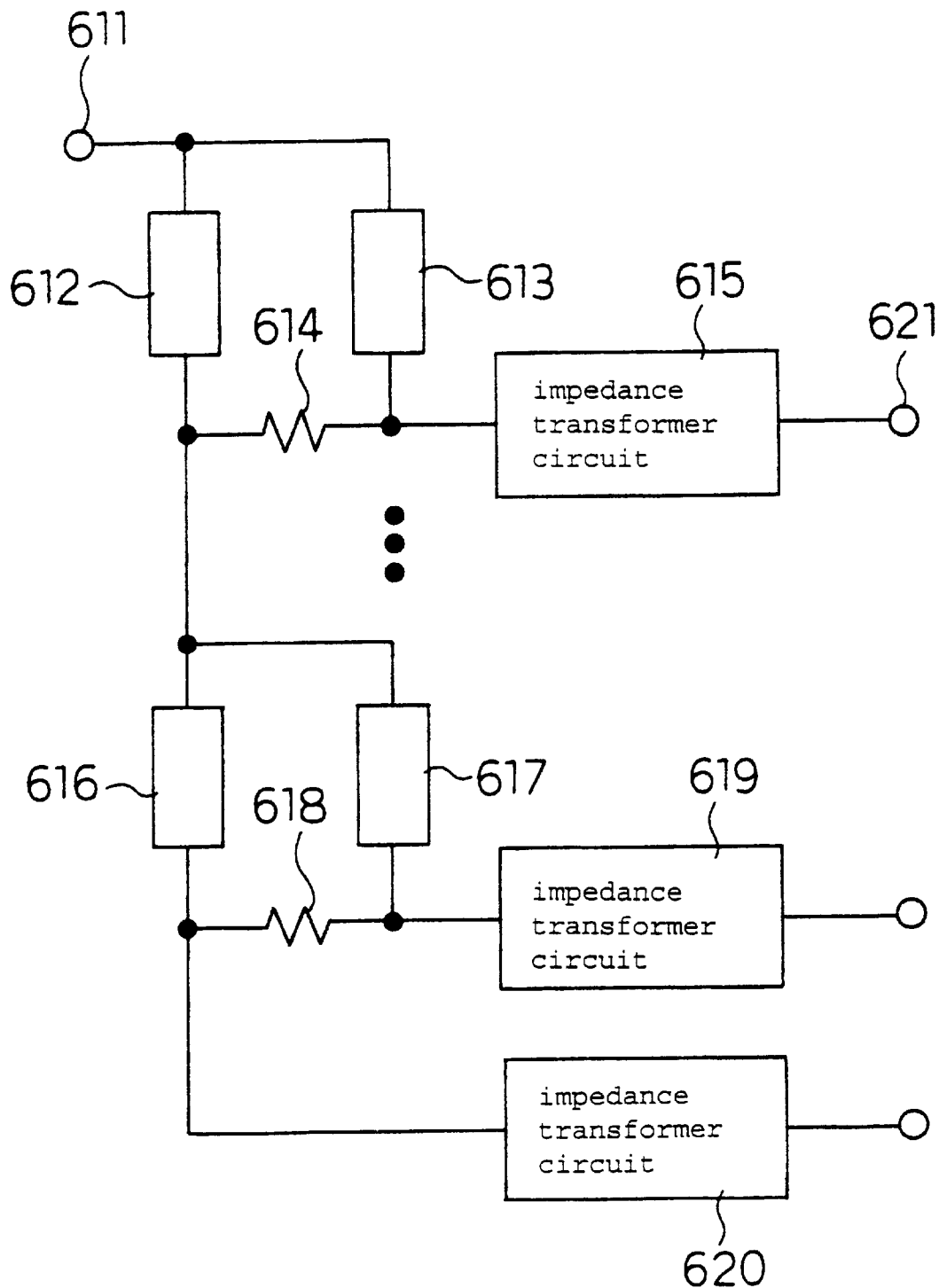
FIG. 13 is a circuit diagram of a one-input, multi-splitter comprising a Wilkinson asymmetric power splitter.
Figure 14:
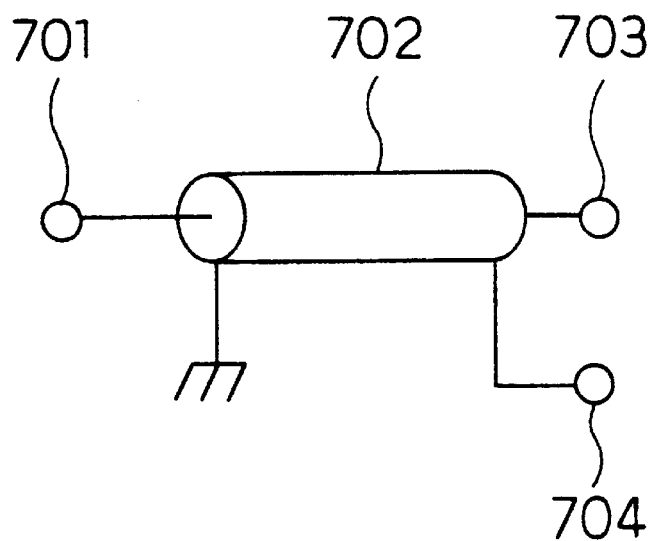
FIG. 14 is a view showing the configuration of a conventional balun for a high power amplifier.

Moreover, it has been described that all the portions of the main and coupling lines are formed of straight lines in the above-mentioned third to fifth embodiments of the present invention. However, in addition to this configuration, a part or all of the lines may be formed of a curve, provided that a part of the main line and a coupling line being in face-to-face relationship to each other are disposed, superimposed on each other in a direction perpendicular to the surfaces of the conductor pattern layers, like the relationship between the part 7040 of the main line and the coupling line 7050 shown in FIG. 9. Additionally, a part of the main line and a coupling line in face-to-face relationship to each other may be disposed to superimpose on each other when the coupling line is moved only in a direction perpendicular to the lengthwise direction of the main line but not rotated, like the relationship between the part 8040 of the main line and the coupling line 8050 shown in FIG. 10. In short, the coupling line facing part of the main line should only be disposed on the conductor pattern layer rather than the conductor pattern layer on which the part of the main line is disposed, to electromagnetically couple with the part of the main line which the coupling line faces. However, the coupling degree in the configuration where the coupling line is disposed to superimpose on part of the main line when the coupling line is moved in a direction perpendicular to the lengthwise direction of part of the line but not rotated, is smaller than that in the configuration where the coupling line and part of the main line are superimposed completely on each other in a direction perpendicular to the surfaces of the conductor pattern layers.

As clearly disclosed by the above descriptions, the present invention can provide a balun capable of being made smaller in circuit by incorporating the functions of a splitter (combiner). Consequently, the present invention is effective in miniaturizing a high power amplifier wherein a plurality of push-pull amplifiers are combined in parallel.

What is claimed is:

1. A balun comprising:

a multilayer comprised of dielectric layers and conductor pattern layers stacked alternately;

a main line disposed on one of said conductor pattern layers;

a plurality of coupling lines each facing a part of said main line, disposed on one or more of said conductor pattern layers different from said conductor pattern layer on which said main line is disposed, so as to be electromagnetically coupled with said facing part of said main line, and grounded electrically respectively;

an input line disposed on one of said conductor pattern layers; and output line pairs with respective pairs being connected across corresponding coupling line ends, wherein one end of said main line is connected to said input line, the other end thereof is electrically grounded, the power of a signal input to said input line is split and propagated to each of said output terminal pairs via each of said coupling lines, and a signal propagated from one output line of each said output line pair is 180 degrees out of phase with the other signal propagated from the other output line.

2. A balun in accordance with claim 1, wherein at least one of said coupling lines is disposed on said conductor pattern layer different from one or more of said conductor pattern layers on which the other one or more of said coupling lines is disposed.

3. A balun comprising;

a multilayer comprised of dielectric layers and conductor pattern layers stacked alternately;

a main line disposed on two or more of said conductor pattern layers;

a plurality of coupling lines each facing a part of said main line so as to be electromagnetically coupled with said facing part of said main line, and grounded electrically respectively;

said coupling line which is facing said part of said main line being disposed on said conductor pattern layer different from said conductor pattern layer on which said facing part of said main line is disposed;

an input line disposed on one of said conductor pattern layers; and output line pairs with respective pairs being connected across corresponding coupling line ends, wherein one end of said main line is connected to said input line, the other end thereof is electrically grounded, the power of a signal input to said input line is split and propagated to each said output terminal pairs via each of said coupling lines, and a signal propagated from one output line of each said output line pair is 180 degrees out of phase with the other signal propagated from the other output line.

4. A balun in accordance with claim 3, wherein at least one of said coupling lines is disposed on said conductor pattern layer different from one or more of said conductor pattern layers on which the other one or more of said coupling lines is disposed.

* * * * *